United States Patent [19]

Iwahashi et al.

[11] 4,242,413
[45] Dec. 30, 1980

[54] VAPOR PLATING METHOD FOR PLASTICS

[75] Inventors: Shunji Iwahashi, Toyonaka; Masahiro Yamasaki, Ibaraki; Masakazu Sagou, Takatsuki, all of Japan

[73] Assignee: Sumitomo Chemical Company, Limited, Osaka, Japan

[21] Appl. No.: 790,061

[22] Filed: Apr. 22, 1977

[30] Foreign Application Priority Data

Apr. 22, 1976 [JP] Japan .................. 51-46260

[51] Int. Cl.$^2$ .................. B05D 1/36; B05D 7/04; C23C 13/02; G02B 1/10
[52] U.S. Cl. .................. 428/412; 427/162; 427/164; 427/250; 428/447
[58] Field of Search .................. 427/250, 404, 407 C, 427/162, 164, 166; 428/412, 447

[56] References Cited

U.S. PATENT DOCUMENTS

| | | | |
|---|---|---|---|
| 3,677,792 | 7/1972 | Best | 427/407 C |
| 3,891,486 | 6/1975 | Willdorf | 427/250 X |
| 3,957,918 | 3/1976 | Dickie et al. | 427/250 X |
| 3,978,252 | 8/1976 | Lombardo et al. | 427/250 X |
| 4,005,238 | 1/1977 | Gaehde et al. | 427/404 X |
| 4,016,305 | 4/1977 | Wakabayashi et al. | 427/404 X |

FOREIGN PATENT DOCUMENTS

734890  5/1966  Canada .................. 427/404

*Primary Examiner*—James R. Hoffman
*Attorney, Agent, or Firm*—Birch, Stewart, Kolasch & Birch

[57] ABSTRACT

The surface of a plastic substrate is effectively vapor plated with a metal by coating said surface with a coating composition comprising the following components dissolved in a solvent prior to the vapor plating: (A) (i) a co-partial hydrolysis product of an organosiloxane compound of the formula: $R_nSi(OR')_{4-n}$ (wherein n is an integer of 1 to 3, R is a hydrocarbon group having 1 to 6 carbon atoms and R' is an alkyl group having 1 to 4 carbon atoms) and a tetraalkoxysilane, or (ii) a mixture of each partial hydrolysis product of said organosiloxane compound and said tetraalkoxysilane, or (iii) a mixture of said co-partial hydrolysis product (i) and said mixture of each partial hydrolysis product (ii), the amount of the partial hydrolysis product of said tetraalkoxysilane (calculated as $SiO_2$) being 5 to 100 parts by weight to 100 parts by weight of the partial hydrolysis product of said organosiloxane compound (calculated as $R_nSiO_{(4-n)/2}$ wherein n and R are each as defined above); and (B) (i) a copolymer of at least one of alkyl acrylates and alkyl methacrylates with at least one of hydroxyalkyl acrylates and hydroxyalkyl methacrylates, and (ii) an etherified methylolmelamine, the amounts of said copolymer (i) and said etherified methylolmelamine (ii) being 5 to 200 parts by weight and 0 to 150 parts by weight, respectively, based on 100 parts by weight of the partial hydrolysis product of the organosiloxane compound (calculated as $R_nSiO_{(4-n)/2}$ wherein n and R are each as defined above).

5 Claims, No Drawings

VAPOR PLATING METHOD FOR PLASTICS

The present invention relates to vapor plating of the surface of a plastic substrate with a metal. More particularly, it relates to a process for vapor plating the surface of a plastic substrate with a metal improving the smoothness of said surface and assuring the adhesion between said substrate and said metal.

In order to provide a good plated surface on a plastic substrate, it is necessary to eliminate unevenness and wounds on the surface of such substrate and besides to improve the adhesion between the plastic substrate and the metal vapor-plated thereon.

When various scratches (e.g. scratches by metallic edged tools, scratches on molding) are present on the surface of a plastic substrate, vapor plating thereon makes the scratches noticeable and the appearance of the surface poor, because a reflection effect is generally increased by vapor plating. On the other hand, the adhesion between the substrate surface and the metal is largely affected by the degree of cleanness of such surface. Even slight dirt of oils and fats attached to the substrate surface affords a serious influence on the adhesion. Consequently, the substrate surface is generally cleaned by pre-cleaning treatments with detergents, solvents or acids and cleaning treatments such as rinsing, followed by drying, ion irradiation, heating, etc. Thus, the cleaning process is very complicated. In addition, a plastic substrate is easily chargeable so that they attract dust when left in air, and this may cause pin spots on vapor plating. Accordingly, the places where vapor plating is carried out must be equipped with a dust-proof and dust-removing apparatus.

As the result of extensive studies, it has now been found that the formation of a film of a certain specific coating composition on the surface of a plastic substrate prior to vapor plating with a metal is highly effective in making the said surface smooth and improving the adhesion between the substrate and the metal. The resulting metallized surface is very smooth, having an increased reflectance, and low image distortion when used as a mirror.

According to the present invention, the surface of a plastic substrate receives the application of a coating composition comprising the following components dissolved in a solvent to make a coating film thereon prior to vapor plating with a metal:

(A)
 (i) a co-partial hydrolysis product of an organosiloxane compound of the formula: $R_nSi(OR')_{4-n}$ (wherein n is an integer of 1 to 3, R is a hydrocarbon group having 1 to 6 carbon atoms and R' is an alkyl group having 1 to 4 carbon atoms) and a tetraalkoxysilane, or
 (ii) a mixture of each partial hydrolysis product of said organosiloxane compound and said tetraalkoxysilane, or
 (iii) a mixture of said co-partial hydrolysis product (i) and said mixture of each partial hydrolysis product (ii), the amount of the partial hydrolysis product of said tetraalkoxysilane (calculated as $SiO_2$) being 5 to 100 parts by weight to 100 parts by weight of the partial hydrolysis product of said organosiloxane compound (calculated as $R_nSiO_{(4-n)/2}$ wherein n and R are each as defined above); and (B)
 (i) a copolymer of at least one of alkyl acrylates and alkyl methacrylates with at least one of hydroxyalkyl acrylates and hydroxyalkyl methacrylates, and
 (ii) an etherified methylolmelamine, the amounts of said copolymer (i) and said etherified methylolmelamine (ii) being 5 to 200 parts by weight and 0 to 150 parts by weight, respectively, based on 100 parts by weight of the partial hydrolysis product of the organosiloxane compound (calculated as $R_nSiO_{(4-n)/2}$ wherein n and R are each as defined above).

The alkoxy group in the tetraalkoxysilane may be methoxy, ethoxy, propoxy, butoxy, etc. In the organosiloxane compound, the hydrocarbon group represented by the symbol R may be a saturated hydrocarbon group such as alkyl (e.g. methyl, ethyl, propyl) or an unsaturated hydrocarbon group such as alkenyl (e.g. allyl). It may be also aliphatic such as alkyl or aromatic such as phenyl. Examples of the alkyl group represented by the symbol R' include methyl, ethyl, propyl and butyl.

The partial hydrolysis products (A) are obtainable by hydrolyzing the tetraalkoxysilane and the organosiloxane compound separately or in mixtures in the presence of an acid in a solvent such as a mixture of water and an alcohol. Said partial hydrolysis products (A) are also obtainable by direct hydrolysis of silicon chlorides such as $SiCl_4$ and $R_nSiCl_{4-n}$ wherein R and n are each as defined above. In general, better results are often obtained by mixing these siloxane compounds and co-hydrolyzing them at the same time than by hydrolyzing them separately. Particularly, as to the organosiloxane compound wherein n is 2 or 3, it is preferred to mix together the organosiloxane compound and the tetraalkoxysilane, followed by co-hydrolyzing.

The amount of the partial hydrolysis product of the tetraalkoxysilane (calculated as $SiO_2$) is 5 to 100 parts by weight to 100 parts by weight of the partial hydrolysis product of the organosiloxane compound (calculated as $R_nSiO_{(4-n)/2}$). When the amount of the former product exceeds 100 parts by weight, the resulting coating film tends to become poor in resistance to hot water and thermal shock test. The preferred amount thereof depends on the said resistances.

The copolymer (B) (i) may be obtained by copolymerization of at least one of alkyl acrylates and alkyl methacrylates and at least one of hydroxyalkyl acrylates and hydroxyalkyl methacrylates in a conventional manner, e.g. by subjecting them to bulk polymerization, emulsion polymerization, suspension polymerization or solution polymerization in the presence of a radical polymerization initiator such as azobisisobutyronitrile, benzoyl peroxide or di-tert-butyl peroxide.

The alkyl (meth)acrylates include the (meth)acrylic esters of alcohols having 1 to 18 carbon atoms. Among them, ethyl (meth)acrylate, propyl (meth)acrylate, butyl (meth)acrylate, 2-ethylhexyl (meth) acrylate, lauryl (meth)acrylate and the like are particularly useful. The hydroxyalkyl (meth)acrylates include, for example, 2-hydroxyethyl (meth)acrylate, hydroxypropyl (meth)acrylate, hydroxybutyl (meth)acrylate, glycerol mono(meth)acrylate, etc.

The weight ratio of the alkyl (meth)acrylate to the hydroxyalkyl (meth)acrylate in the copolymer (B) (i) is not particularly limited, but the range of 1/10 to 10/1 is preferred in terms of the strength of adhesion between the coating film and the substrate surface and the flexibility of such film.

The copolymer (B) (i) is used to improve the flexibility of the coating film. When the amount of the copolymer (B) (i) in the coating composition is less than 5 parts by weight to 100 parts by weight of the partial hydrolysis product of the organosiloxane compound (calculated as $R_nSiO_{(4-n)/2}$), the coating film becomes poor in resistance to thermal shock test, showing a strong tendency toward crackings. When the amount exceeds 200 parts by weight, the coating film tends to cause blushing when dipped in hot water.

The etherified methylolmelamines (B) (ii) which may be optionally used in the coating composition can be produced by well-known methods, and many of them are commercially available. Preferred ones are hexa(alkoxymethyl)melamines such as hexa(methoxymethyl)melamine, hexa(ethoxymethyl)melamine, hexa(propoxymethyl)melamine, hexa(isopropoxymethyl)melamine, hexa(butoxymethyl)melamine and hexa(cyclohexyloxymethyl)melamine.

The etherified methylolmelamine (B) (ii) serves to improvement of the flexibility of the coating film. When the amount of the etherified methylolmelamine to 100 parts by weight of the partial hydrolysis product of the organosiloxane compound (calculated as $R_nSiO_{(4-n)/2}$) exceeds 150 parts by weight, the adhesion property particularly in hot water of the coating film is affected adversely.

As the solvent for the coating composition, there may be used, for instance, alcohols, ketones, esters, ethers, cellosolves, halogenides, carboxylic acids, aromatic compounds and the like. They are properly selected depending upon the kind of the plastic substrate and the rate of vaporization. Lower alkylcarboxylic acids such as formic acid and acetic acid are particularly useful for strengthening the adhesion between the substrate and the coating film. It is particularly effective to use lower alcohols (e.g. methanol, ethanol, propanol, butanol), lower alkylcarboxylic acids (e.g. formic acid, acetic acid, propionic acid), aromatic compounds (e.g. benzene, toluene, xylene) and cellosolves (e.g. methyl cellosolve, butyl cellosolve) in combination. The amount of the solvent used can properly be selected depending upon the required thickness of the coating film, the coating processes and the like.

The coating of the substrate surface with the coating composition may be carried out by any conventional procedure such as spraying, dipping or brushing. Preferred environmental conditions for coating are such that the temperature be not higher than 30° C., favorably 20° C. $\pm 3$° C., and the relative humidity be not higher than 70%, favorably 60% or less, in an atmosphere of dust-free clean air, because such conditions can prevent the coating film from blushing and orange peel on the application of vapor plating thereon.

Cured of the coating film may be accomplished by baking usually at a temperature higher than 70° C. Lowering of the curing temperature and shortening of the curing time is effectively achieved by using a curing accelerator such as acids (e.g. hydrochloric acid, toluenesulfonic acid), organic amines, metallic salts of organic carboxylic acids, metallic salts of thiocyanic acid, metallic salts of nitrous acid and organo-tin compounds.

Then, vapor plating is carried out using commercial vacuum metallizing equipments, such as vacuum metallizing, sputtering and ion plating. In case of vacuum metallizing, the plating process can be carried out under a highly reduced pressure of $1 \times 10^{-3}$ Torr.

The plastic substrate to which the process of this invention is applicable may be the one made of any synthetic resin such as polymethyl methacrylate, polycarbonate, acrylonitrile-butadiene-styrene terpolymer resin, polyacetal, polymethyl methacrylate-styrene copolymer or polystyrene. Particularly suitable resins are acrylic resins. When a higher adhesion is required, previous undercoating of the substrate with an acrylic primer (e.g. solutions of polymethyl methacrylate in solvents, ordinary acrylic lacquers, thermosetting acrylic paints) is recommended.

Examples of the metal to be used for vapor plating are chromium, aluminum, nickel, copper, gold, silver, etc. After a vapor plated film is formed, the film may be protected by applying a top-coating agent or a back-painting agent thereon.

The process of the present invention can be applied for obtaining a smooth and beautiful surface, and therefore it is particularly suitable for producing mirror with transparent synthetic resins.

The present invention will be illustrated in more detail with reference to the following examples, but the present invention is not limited to these examples. Unless otherwise stated, all percentages in the examples are by weight.

EXAMPLE 1

(1) Preparation of the solution of co-partial hydrolysis products of tetraethoxysilane and methyltriethoxysilane (Component I)

A mixed aqueous solution of isopropyl alcohol (68 g), tetraethoxysilane (10 g), methyl triethoxysilane (100 g) and an appropriate amount of an acid and a solvent was charged in a reaction vessel equipped with a reflux condenser and refluxed for 5 hours while being stirred. The reaction mixture was cooled to room temperature to obtain a solution of co-partial hydrolysis products. The resulting solution contained 1.3% (calculated as $SiO_2$) of the partial hydrolysis product of tetraethoxysilane and 17.5% (calculated as $CH_3SiO_{1.5}$) of the partial hydrolysis product of methyltriethoxysilane.

(2) Synthesis of the acrylic copolymer (Component II)

40 g of butyl acrylate, 10 g of 2-hydroxyethyl methacrylate and 0.5 g of azobisisobutyronitrile were dissolved in 300 g of ethyl alcohol and polymerized at 70° C. for 5 hours with stirring in the nitrogen atmosphere. After the reaction was finished, the reaction mass was poured in petroleum ether and the unreacted monomer was removed to obtain the objective copolymer.

(3) Preparation of the coating composition 100 parts by weight of the solution of Component I, 10 parts by weight of Component II and 5 parts by weight of hexa(butoxymethyl)malamine were mixed together. The mixture was dissolved in the mixed solvent of 60 parts by weight of n-butanol, 40 parts by weight of acetic acid and 20 parts by weight of xylene. Thereafter, 0.4 part by weight of sodium acetate and 0.2 part by weight of a surface active agent ("NUC Silicone Y 7006" manufactured by Nippon Unicar Co., Ltd.) were dissolved in this solution to prepare a composition.

(4) Cleaning treatment and coating

Polymethyl methacrylate resin "Sumipex B MHO" manufactured by Sumitomo Chemical Company, Limited) was injection-molded into rectangular plates (250 mm × 50 mm × 4 mm) at an injection pressure of 1200 kg/cm² to make a molded plate. Before coating with the coating composition, the molded plate was subjected to cleaning treatment. The degree of cleaning was expressed by (a), (b), (c) and (d), and either of them was applied to the molded plate.

(a) No cleaning treatment
(b) Hot water (50° C.) rinsing
(c) Rinsing with 1% aqueous detergent solution of 50° C. (a neutral detergent "New Family ®" manufactured by Kao Soap Co., Ltd.)
(d) Cleaning by the ion irradiation process at a vacuum of $1 \times 10^{-4}$ Torr for 15 minutes, using the ion irradiation equipment mounted, as a set, on a vacuum metallizing equipment ("Model EG-6" manufactured by Shinko Seiki Co., Ltd.)

The molded plate cleaned by (a), (b), (c) or (d) was coated with the coating composition at the both sides and heated at 70° C. for 3 hours to obtain a coating film having excellent transparency.

(5) Vacuum metallizing and performance test on metallized products

Vacuum metallizing of chromium or aluminum was applied at a vacuum of $1 \times 10^{-5}$ Torr for 1 minute to the molded plate as coated and cleaned in (4) using the vacuum metallizing equipment ("Model EG-6" manufactured by Shinko Seiki Co., Ltd.).

The vacuum-metallized polymethyl methacrylate molded plates were tested as follows:

Adhesion property

The vacuum-metallizing film was cut, crosswise at 1 mm intervals, deeply to the underlying substrate surface with a steel knife. Thus, 100 square meshes (1 mm × 1 mm) were produced on the film. A cellophane tape (manufactured by Sekisui Kagaku Co., Ltd.) was stuck thereon and strongly torn off upward and vertically. The adhesion property was evaluated by the number of the untorn meshes.

Thermal shock test

The test samples were placed in a hot-air dryer of 80° C. for 30 minutes and then in an ice water of 0° C. for 30 minutes. After this operation was repeated ten times, the state of the vacuum-metallizing film was checked.

Visual observation of appearance (1) Prior to the cleaning, coating and vacuum metallizing processes, finger marks were previously marked on the respective plates at the surfaces to be metallized. After the final vacuum metallizing treatment was applied to every plates, whether or not the finger marks were visually observable was tested. The case where the finger mark disappeared and was not visually observable was graded as "good", and the opposite case was graded as "poor".

(2) Prior to the coating and vacuum metallizing processes, scratches of about 3 cm long were previously marked by a nail on the respective plates at the surfaces to be metallized. After the final vacuum metallizing treatment was applied to every plate, whether or not the scratches were visually observable was tested. The case where the scratch disappeared and was not visually observable was graded as "good", and the opposite case was graded as "poor".

The results of the above-mentioned performance tests are summarized in Table 1. In Examples 1 to 5, the thermal shock test showed good results and the vacuum-metallizing films showed no peeling such as blistering and cracking.

TABLE 1

| Example No. | Coating | Cleaning treatment | Metal applied | Adhesion property | Appearance (1) | Appearance (2) |
|---|---|---|---|---|---|---|
| 1 | carried out | a | Cr | 100/100 | good | good |
| Reference Example 1 | not carried out | a | Cr | 4/100 | poor | poor |
| 2 | carried out | b | Cr | 100/100 | good | good |
| Reference Example 2 | not carried out | b | Cr | 4/100 | poor | poor |
| 3 | carried out | c | Cr | 100/100 | good | good |
| Reference Example 3 | not carried out | c | Cr | 98/100 | good | poor |
| 4 | carried out | d | Cr | 100/100 | good | good |
| Reference Example 4 | not carried out | d | Cr | 5/100 | poor | poor |
| 5 | carried out | a | Al | 100/100 | good | good |
| Reference Example 5 | not carried out | a | Al | 2/100 | poor | poor |

What is claimed is:

1. A process for vapor plating the surface of a plastic substrate with a metal, said plastic substrate being made of a material selected from the group consisting of polymethyl methacrylate, polycarbonate, acrylonitrilebutadiene-styrene terpolymer, polyacetal, methyl methacrylate-styrene copolymer and polystyrene comprising; coating said surface with a coating composition to form a coating film on said surface for making said surface smooth and improving the adhesion between said substrate and said metal, and vapor plating the coated surface with the metal, said coating composition comprising the following components dissolved in a solvent:

(A)
a product obtained by partial hydrolysis of a mixture
of a compound of the formula: $R_nSi(OR')_{4-n}$ wherein n is an integer of 1 to 3, R is a hydrocarbon group having 1 to 6 carbon atoms and R is an alkyl group having 1 to 4 carbon atoms, and a tetraalkoxysilane, or
(ii) a mixture of each partial hydrolysis product of said $R_nSi(OR')_{4-n}$ compound and the partial hydrolysis product of said tetraalkoxysilane, or
(iii) a mixture of said partial hydrolysis product (i) and said mixture of each partial hydrolysis products (ii),
the amount of the partial hydrolysis product of said tetraalkoxysilane, calculated as $SiO_2$, being 5 to 100 parts by weight to 100 parts by weight of the partial hydrolysis product of said $R_nSi(OR')_{4-n}$ compound, calculated as $R_nSiO_{(4-n)/2}$, wherein n and R are each as defined above; and (B)
(i) a copolymer of at least one of alkyl acrylates and alkyl methacrylates with at least one of hydroxyalkyl acrylates and hydroxyalkyl methacrylates, and
(ii) etherified methylolmelamine, the amounts of said copolymer (i) and said etherified methylolmelamine (ii) being 5 to 200 parts by weight and 0 to 150 parts by weight, respectively, based on 100 parts by weight of the partial hydrolysis product of said $R_nSi(OR')_{4-n}$ compound, calculated as $R_nSiO_{(4-n)/2}$, wherein n and R are each as defined above.

2. The process according to claim 1, wherein the weight ratio of the alkyl acrylate, the alkyl methacrylate or the mixture thereof to the hydroxyalkyl acrylate, the hydroxyalkyl methacrylate or the mixture thereof is 1/10 to 10/1.

3. The process according to claim 1, wherein the coating is effected at a temperature of not higher than 30° C. under a relative humidity of not higher than 70% in an atmosphere of dust-free clean air.

4. A plastic product plated by the process of claim 1.

5. A process for producing a plastic mirror having low image distortion comprising coating the surface of a plastic substrate made of a material selected from the group consisting of polymethyl methacrylate, with a coating composition to form a coating film on said surface for making said surface smooth and improving the adhesion between said substrate and a metal, and vapor plating the coated surface with the metal said coating composition comprising the following components dissolved in a solvent:

(A)
(i) a product obtained by partial hydrolysis of a mixture of a compound of the formula: $R_nSi(OR')_{4-n}$, wherein n is an integer of 1 to 3, R is a hydrocarbon group having 1 to 6 carbon atoms, and R' is an alkyl group having 1 to 4 carbon atoms and a tetraalkoxysilane, or (ii) a mixture of each partial hydrolysis product of said compound of the formula: $R_nSi(OR')_{4-n}$ and said tetraalkoxysilane, or (iii) a mixture of said partial hydrolysis product (i) and said mixture of each partial hydrolysis product (ii), the amount of the partial hydrolysis product of said tetraalkoxysilane, calculated as $SiO_2$ being 5 to 100 parts by weight to 100 parts by weight of the partial hydrolysis product of said compound of the formula $R_nSi(OR')_{4-n}$ calculated as $R_nSiO_{(4-n)/2}$, wherein n and R are each as defined above; and (B)
(i) a copolymer of at least one of alkyl acrylates and alkyl methacrylates with at least one of hydroxyalkyl acrylates and hydroxyalkyl methacrylates, and (ii) an etherified methylolmelamine, the amounts of said copolymer (i) and said etherified methylolmelamine (ii) being 5 to 200 parts by weight and 0 to 150 parts by weight, respectively, based on 100 parts by weight of the partial hydrolysis product of said compound of the formula: $R_nSi(OR')_{4-n}$, calculated as $R_nSiO_{(4-n)/2}$, wherein n and R are each as defined above.

* * * * *